United States Patent [19]

Pak

[11] Patent Number: 4,607,744
[45] Date of Patent: Aug. 26, 1986

[54] METHOD AND APPARATUS FOR REMOVING INTEGRATED CIRCUIT CHIPS FROM A FLEXIBLE CARRIER

[76] Inventor: Chong-Il Pak, 3610 Bassett St., #5, Santa Clara, Calif. 95050

[21] Appl. No.: 649,080

[22] Filed: Sep. 10, 1984

[51] Int. Cl.⁴ ............................................. B65G 47/31
[52] U.S. Cl. ..................................... 198/461; 198/750; 206/328; 221/74; 242/74.2
[58] Field of Search .................. 414/403, 416; 221/71, 221/74; 206/328, 330; 29/759, 849; 198/461, 750; 242/74, 74.1, 74.2

[56] References Cited

U.S. PATENT DOCUMENTS

| | | | |
|---|---|---|---|
| 1,160,792 | 11/1915 | Van Houten | 198/461 |
| 1,672,522 | 6/1928 | Greer et al. | 198/472 |
| 2,059,242 | 11/1936 | Jung | 242/74.2 |
| 2,503,771 | 4/1950 | Roll | 198/750 X |
| 2,542,330 | 2/1951 | Henderson et al. | 198/461 X |
| 3,562,057 | 2/1971 | McAlister et al. | 206/328 X |
| 3,606,035 | 9/1971 | Gantley | 414/28 |
| 4,089,725 | 5/1978 | Crankshaw et al. | 221/74 X |
| 4,095,926 | 6/1978 | Paul | 198/457 X |
| 4,235,328 | 11/1980 | Marshall | 198/480 X |

Primary Examiner—Robert J. Spar
Assistant Examiner—Jonathan D. Holmes
Attorney, Agent, or Firm—Paul L. Hickman

[57] ABSTRACT

An apparatus for removing integrated circuit chips from a flexible carrier characterized by a base, a separator plate including a separator edge coupled to the base, a take-up drum rotatably attached to the base and adapted to draw the flexible carrier past the separator edge, a tensioning mechanism for providing a tensioning force on the flexible carrier, and a conveyor for transporting separated chips away from the separating edge. The take-up drum and conveyor mechanism are simultaneously operated by rotating a knob.

6 Claims, 13 Drawing Figures

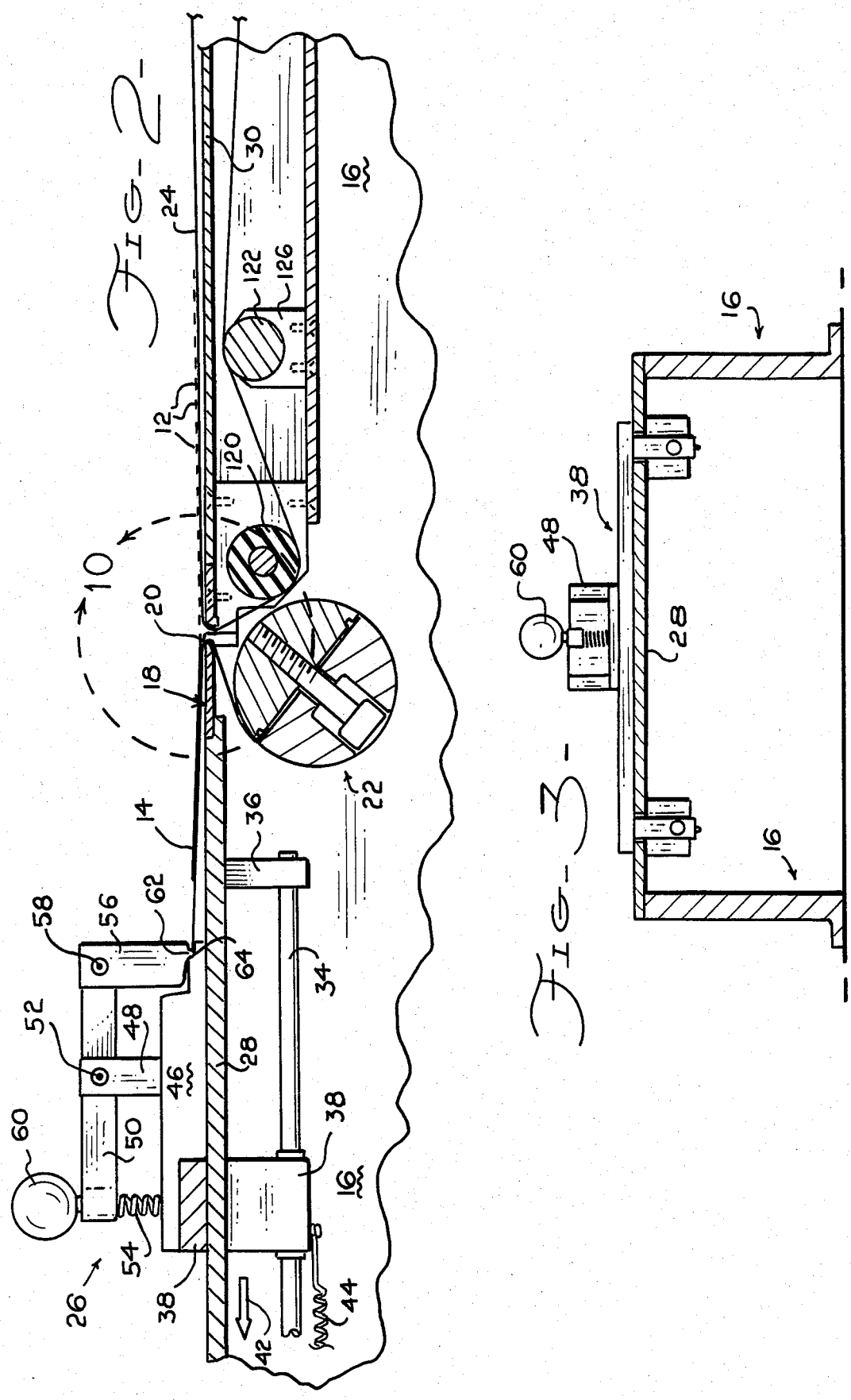

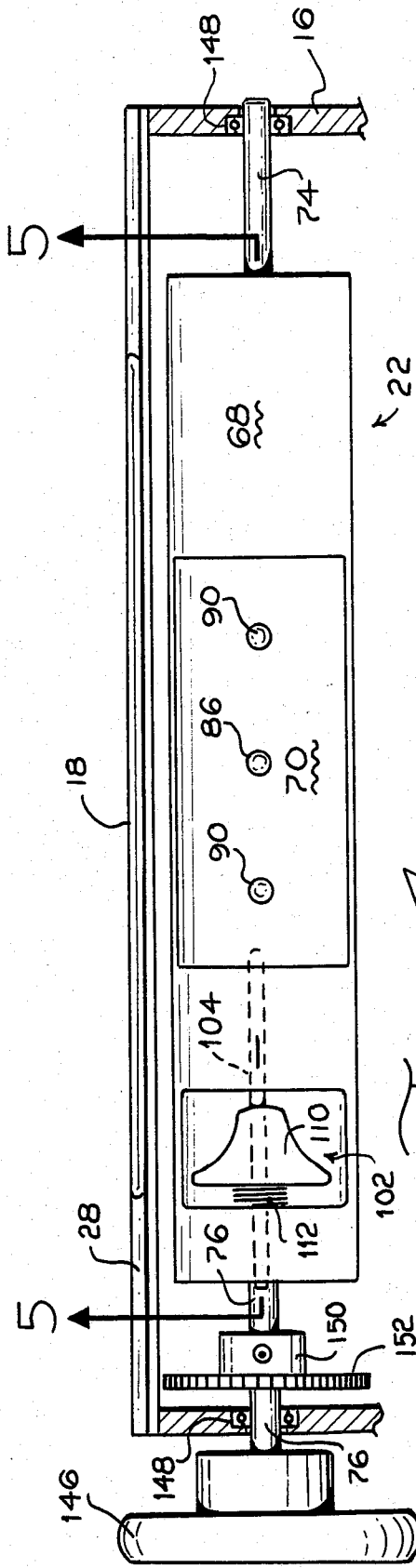
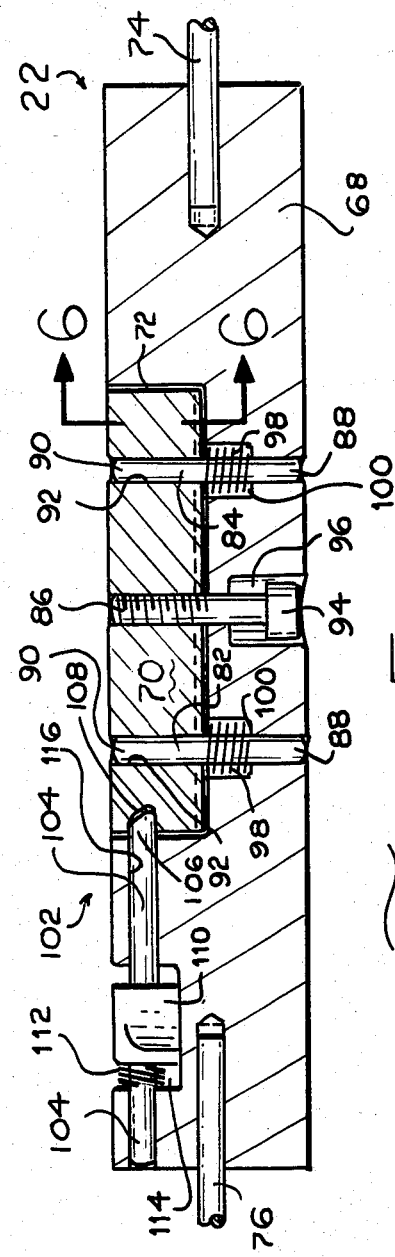
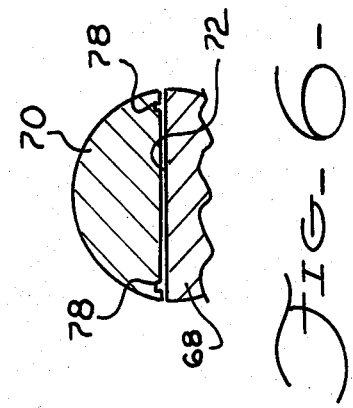

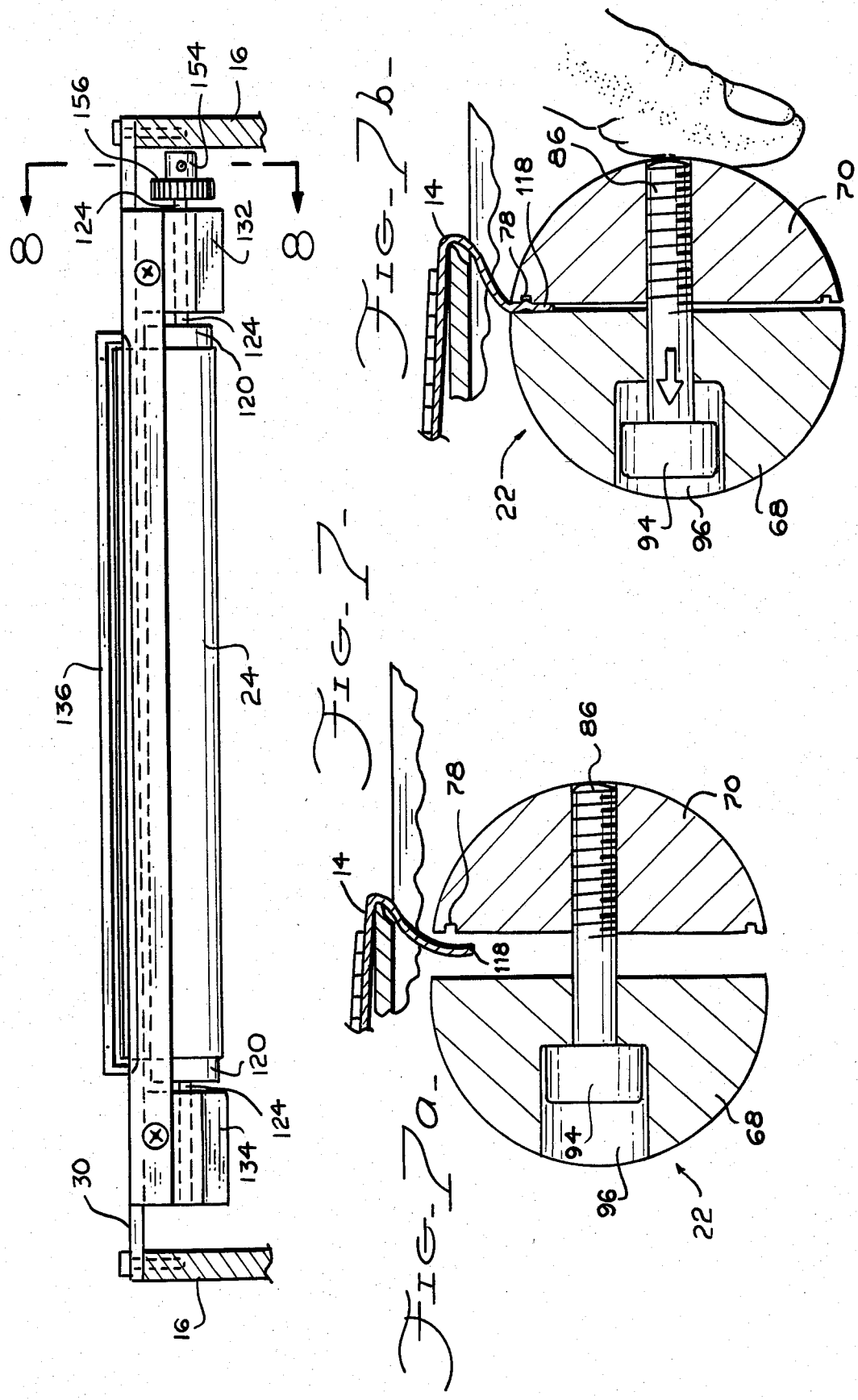

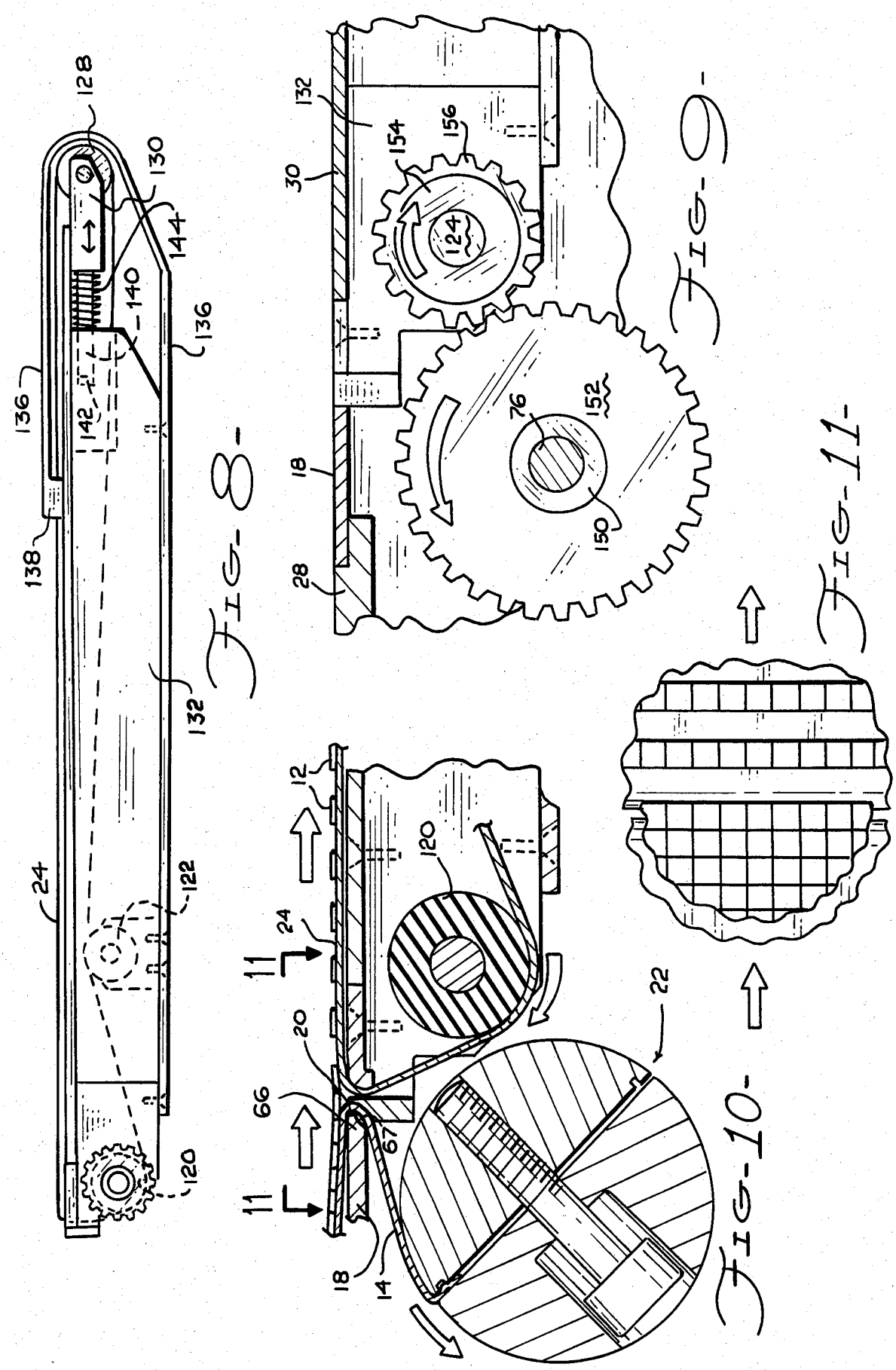

METHOD AND APPARATUS FOR REMOVING INTEGRATED CIRCUIT CHIPS FROM A FLEXIBLE CARRIER

BACKGROUND OF THE INVENTION

1. Field of the Invention

This invention relates generally to machines used in the processing of integrated circuit chips, and more particularly to devices for removing integrated circuit chips from their flexible carrier substrate.

2. Description of the Prior Art

Integrated circuit chips are small sections of semiconductive material (such as silicon) upon which many active and/or passive electronic components have been formed. The manufacture of an integrated circuit chip includes steps of processing a semiconductor wafer to provide multiples of the desired chip, and then cutting the wafer into individual integrated circuit chips arranged in rows and columns.

Before the wafer is cut, it is adhesively attached to flexible carrier to prevent the dispersal of the chips during the cutting process. A problem encountered in the prior art is how to efficiently remove the individual chips from the flexible carrier without damaging the chips. In the past, the carrier has been stretched onto a frame, and a blunt tipped pin was pressed against the underside of the carrier to raise an individual chip above the surface level of the remainder of the chips. Tweezers were then used to remove the individual chips from the carrier. This method is not only time consuming and labor intensive, but also results in the damage of many of the chips due their manual handling.

SUMMARY OF THE INVENTION

An object of this invention is to provide a method and apparatus for quickly removing integrated circuit chips from their flexible carrier.

Another object of this invention is to provide a method and apparatus for removing integrated circuit chips from their carrier such that the individual chips are not damaged by manual handling.

Briefly, the apparatus of the invention comprises a base, a separator plate coupled to the base, a take-up drum rotatably coupled to the base and adapted to grasp a leading edge of the carrier, a tensioning mechanism adapted to grasp a trailing edge of the carrier, and a conveyor mechanism for transporting the separated rows of chips away from the separator plate.

A powering mechanism simultaneously rotates the take-up drum and actuates the conveyor. When the powering mechanism is rotated, the carrier is drawn past an edge of the separator plate to separate a row of integrated circuit chips from the carrier. The conveyor, which has a leading end disposed proximate the edge of the separator plate, collects the row of chips as they are removed from the carrier and transports the chips away from the separator plate.

The method of the present invention is to grasp a leading edge of a flexible carrier to which a plurality of integrated circuit chips are attached, tensioning the flexible carrier by grasping a trailing edge of the carrier and providing a biasing force away from the leading edge, drawing the flexible carrier past a separator edge to separate a row of chips from the carrier, and transporting the row of chips away from the separator edge.

An advantage of this invention is that integrated circuit chips can be more quickly separated from their flexible carrier than was possible in the prior art.

A further advantage of this invention is that fewer integrated circuit chips are damaged during the removal process than was the case with the prior art.

These and other objects and advantages of the present invention will no doubt become apparent upon a reading of the following descriptions and a study of the several figures of the drawing.

BRIEF DESCRIPTION OF THE DRAWING

FIG. 2 is a cross sectional view taken along line 2—2 of FIG. 1;

FIG. 3 is a cross sectional view taken along line 3—3 of FIG. 1;

FIG. 4 is a cross sectional view taken along line 4—4 of FIG. 1;

FIG. 5 is a cross sectional view taken along line 5—5 of FIG. 4;

FIG. 6 is a cross sectional view taken along line 6—6 of FIG. 5;

FIG. 7 is a cross sectional view taken along line 7—7 of FIG. 1;

FIGS. 7a and 7b are cross sectional views illustrating the operation of the take-up drum illustrated in FIG. 5;

FIG. 8 is a cross sectional view taken along line 8—8 of FIG. 7;

FIG. 9 is a cross sectional view taken along line 9—9 of FIG. 1;

FIG. 10 is a detailed view taken along line 10 of FIG. 2; and

FIG. 11 is a view taken along line 11—11 of FIG. 10.

DETAILED DESCRIPTION OF THE PREFERRED EMBODIMENT(S)

Figure 1:
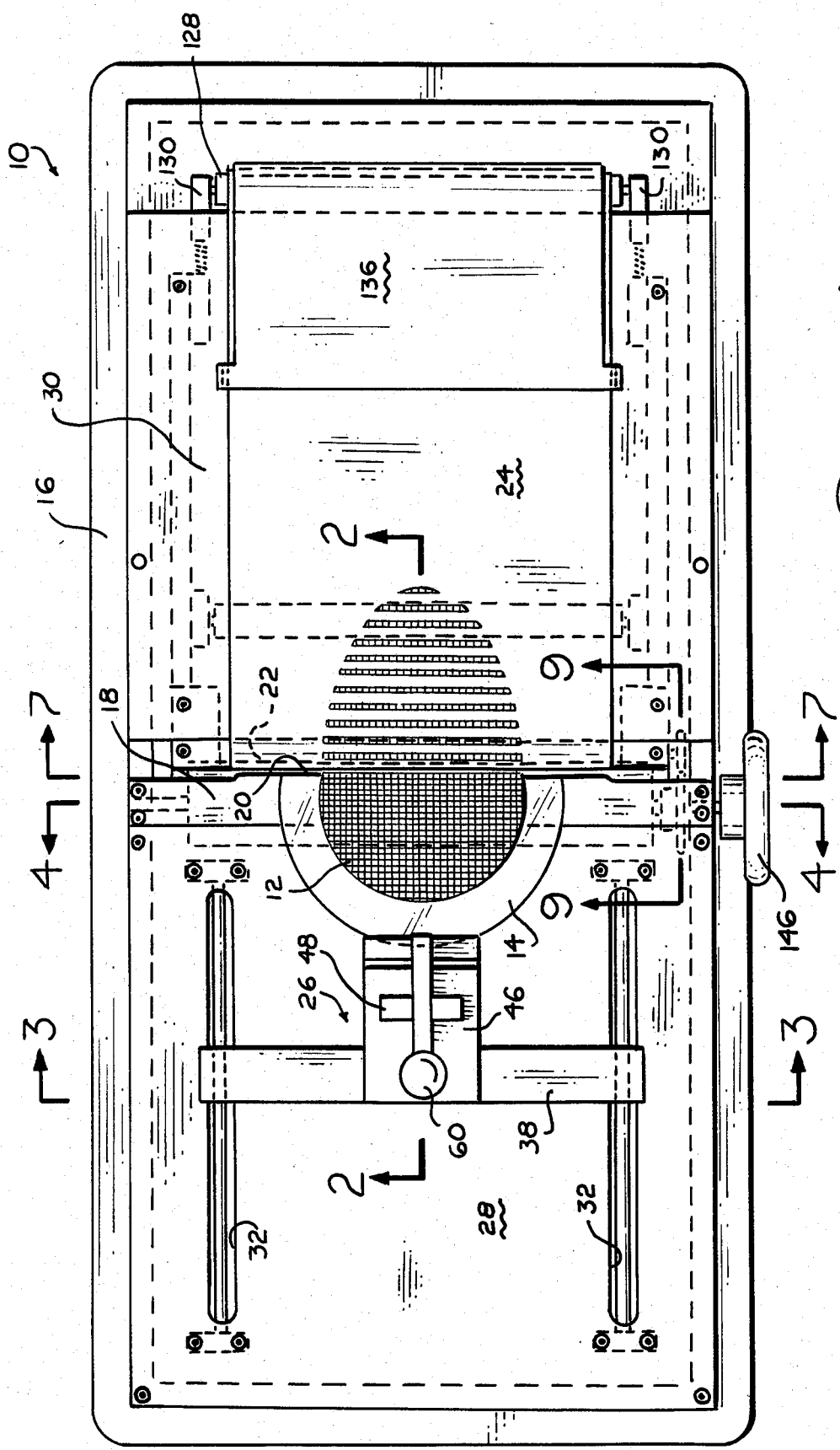
FIG. 1 is a top plan view of an apparatus for removing integrated circuit chips from a flexible carrier in accordance with the present invention.

Referring to the top plan view of FIG. 1, an apparatus 10 for removing integrated circuit chips 12 from a flexible carrier 14 includes a base 16, a separator plate 18 including a separator edge 20 which is attached to base 16, a take-up drum 22, a conveyor 24, and a tensioning mechanism 26. As will be described in greater detail subsequently, the purpose of apparatus 10 is to remove rows of chips 12 from carrier 14 and to deposit them on conveyor 24.

Referring now additionally to FIGS. 2 and 3, a first support plate 28 is attached over one end of base 16, and a second support plate 30 is attached over the other end of base 16. First support plate 28 is provided with a pair of elongated slots 32 through its surface.

Tensioning mechanism 26 includes a guide rail 34 attached to the underside of support plate 28 by a pair of posts 36. A "U" shaped carriage 38 is provided with a pair of linear bearings 40 on its downwardly depending legs which slidingly engage guide rails 34. Carriage 38 is biased in a direction 42 by an expansion spring 44 which is connected at one to carriage 38 and at its other end to base 16.

The downwardly depending legs of "U" shaped carriage 38 extend through slots 32 of plate 28. A clamping base 46 is attached to a central portion of carriage 38 and will slide along the upper surface of support plate 28 as carriage 38 moves along guide rails 34. A post 48 rises vertically from clamping base 46, and an arm 50 is attached to post 48 by a pivot 52. A compression spring 54 is disposed between a first end of arm 50 and clamping base 46, and a clamping head 56 is pivotably attached to second end of arm 50 by a pivot 58. An optional knob 60 may be provided at the first end of arm 50.

The lower end of clamping head 56 is provided with a protuberance 62 which engages a step 64 provided in clamping base 46. When knob 60 is pushed, clamping head 56 is pivoted away from clamping base 46, and the trailing edge of flexible carrier 14 can be placed over step 64. When knob 60 is released, spring 54 causes protuberance 62 to re-engage step 64 firmly clamping the trailing edge of carrier 14 to clamping base 46. Since clamping base 46 is attached to carriage 38, and since carriage 38 is biased in direction 42, a tensioning force is placed on carrier 14 in a direction away from separator plate 18.

With additional reference to FIG. 10, separator plate 18 includes a tip 66 providing the separator edge 20 and a contoured surface 67. As will be explained subsequently, by placing carrier 14 around tip 66 of separator plate 18 and by wrapping the carrier 14 around the take-up drum 22, the rows of chips 12 are effectively removed from the carrier 14.

Referring now to FIGS. 2, 5, and 6, the take-up drum 22 includes a substantially cylindrical member 68, and a clamping member 70 located within a recess 72 provided in cylindrical member 68. Cylindrical member 68 is supported for rotation about its longitudinal axis by a pair of shafts 74 and 76.

Clamping member 70 is semi-cylindrical in shape and is provided with a pair of grooves 78 which aid in the gripping of carrier 14. As will be discussed in greater detail later, the leading edge of carrier 14 is gripped between clamping member 70 and cylindrical member 68 to attach the carrier to take-up drum 22.

Clamping member 70 is attached to cylindrical member 68 by a pair of guide posts 82 and 84 and a bolt 86. First ends 88 of guide posts 82/84 are pressed into bores provided in cylindrical members 68, and second ends 90 are loosely disposed within bores 92 of clamping member 70. The head 94 of bolt 86 can move within a bore 96 of cylindrical member 68. A pair of compression springs 98 are disposed around midlength portions of guide post 82/84 within recesses 100 of cylindrical member 68, and provide a biasing force on clamping member 70 which would tend to move it away from cylindrical member 68.

A detent mechanism 102 including a shaft 104 having a tip 106 adapted to engage a recess 108 of clamping member 70 is provided to hold the clamping member 70 in its clamping position. A slide 110 is attached to a midlength portion of shaft 104, and a compression spring 112 is disposed between an end of a recess 114 and slide 110 to bias shaft 104 towards clamping member 70. Shaft 104 is free to slide within a bore 116 of cylindrical member 68.

When slide 110 as shown in FIGS. 4 and 5 is moved against spring pressure to the left, tip 106 disengages from recess 108 and clamping member 70 moves away from cylindrical member 68, as illustrated in FIG. 7a. The leading edge 118 is placed between clamping member 70 and cylindrical member 68 in proximity to one of the grooves 78. With reference to FIG. 7b, clamping member 70 is then pushed towards cylindrical member 68, firmly clamping leading edge 118 between the two members. A portion of leading edge 118 deforms to extend into groove 78 to increase the frictional engagement between carrier 14 and take-up drum 22. The take-up drum 22 is held in this position by detent mechanism 102.

Referring again to FIG. 2, conveyor 12 is of the endless belt type and is preferably made from a thin band of stainless steel. It is important that the conveyor be both thin and strong, since the leading edge of the conveyor must be located very close to separator edge 20 so that the small integrated circuit chips will fall into the gap between them.

Conveyor 24 is trained around second support plate 30, a drive cylinder 120, and an idler cylinder 122. Drive cylinder 120, which is preferably made from a high friction material such as hard, synthetic rubber, is mounted on a shaft 124 for rotation. Idler cylinder 122 is rotatably supported by a column 126. With reference to FIG. 1, the end of conveyor 24 is supported by an end cylinder 128 which is rotatably supported between two posts 130.

Referring now to FIGS. 7 and 8, it can be seen that shafts 124 of drive cylinder 120 engage bearings provided in elongated support blocks 132 and 134 which are attached to the underside of second plate 30. A contamination shield 136 is provided with an abutment 138 to prevent the chips 12 from falling off the end of conveyor 24 and thus becoming contaminated, and to keep the hands of the operator off of the conveyor. As best seen in FIG. 8, posts 130 of end cylinder 128 are attached to support blocks 132/134 by studs 140 which are disposed within bores 142 of the support blocks. A compression spring 144 biases posts 130 away from support blocks 132/134 such that end cylinder 128 exerts a tensioning force on conveyor 24.

With reference to FIG. 4, a knob 146 is attached to an end of shaft 76. Shafts 74 and 76 are rotatably coupled to base 16 by bearings 148 such that the take-up drum 22 is free to rotate. A collar 150 attaches a spur gear 152 to shaft 76. In FIG. 7, a collar 154 attaches a spur gear 156 to shaft 124 of drive cylinder 120. As best seen in FIG. 9, the teeth of spur gears 152 and 156 mesh such that the rotation of knob 146 causes the simultaneous rotation of take-up drum 24 and movement of conveyor 24.

In operation, the leading edge of a carrier is engaged with take-up drum 22, and a trailing edge of the carrier is engaged with tensioning mechanism 26. As seen in FIG. 10, take-up drum is caused to rotate in a counterclockwise direction by the counterclockwise rotation of knob 146. Drive cylinder 120 is caused to rotate in a clockwise direction due to the intermeshing of gears 152 and 156 as seen in FIG. 9. Thus, rotation of knob 146 causes the carrier 14 to wrap around a portion of the circumference of take-up drum 22, pulling it around separator edge 20. As the flexible carrier 14 moves past the separator edge 20, the individual chips 12 are removed from carrier 14 and are deposited on conveyor 24.

Due to the difference in the size between gears 152 and 156, conveyor 24 moves in a linear direction more quickly than carrier 14 is wrapped around the take-up drum 22. This permits the rows of chips to be spaced apart for easier pickup and handling. Contamination shield 136 prevents the chips from falling off the end of the conveyor 24 due to operator error.

While this invention has been described in terms of a single preferred embodiment, it is contemplated that various alterations, modifications, and permutations of this invention will become apparent to those skilled in the art. For example, the entire conveyor assembly could be made as a removable module such that another conveyor module can be snapped into its place. In this way, the apparatus 10 can be used in a continuous fashion by one operator while other operators move the individual chips 12 from a conveyor module.

It is therefore intended that the following appending claims be interpreted as including all such alterations, permutations and modifications as fall within the true spirit and scope of the present invention.

What is claimed is:

1. An apparatus for removing integrated circuit chips adhering to an upper surface of a flat, flexible carrier, said apparatus comprising:

base means;

a flat support surface coupled to said base means, said support surface having a first end and a second end;

continuous conveyor means coupled to said base means, said conveyor means having a flat transport surface which is substantially coplanar with said support surface, said transport surface being adapted to move in a direction from a first end of said conveyor means to a second end of said conveyor means;

a separation member coupled to said base means proximate said second end of said support surface, said separation member having a separation edge at an upper surface thereof which is substantially coplanar with said support surface and said transport surface, wherein said separation edge and said first end of said conveyor means are separated by a narrow gap;

take-up means coupled to said base means below said support surface, said take-up means being adapted to grip said carrier and exert a first force on said carrier to pull it through said narrow gap such that a lower surface of said carrier engages said separation edge; and tensioning means engaged with said support surface, said tensioning means being adapted to exert a second force on said carrier which opposes said first force exerted by said take-up means;

whereby pulling said carrier past said separation edge by said take-up means peels said carrier away from said integrated circuit chips to separate said integrated circuit chips from said carrier, said separated integrated circuit chips being deposited by their forward motion on said transport surface of said conveyor means across said narrow gap.

2. An apparatus as recited in claim 1 wherein said separation member is a flat, rectangular plate having said separation edge along a longitudinal side thereof and having an undercut portion beneath said separation edge, whereby said carrier is bent around said longitudinal side such that pressure exerted on said underside of said carrier is localized along said separation edge.

3. An apparatus as recited in claim 1 further comprising drive means coupled to said conveyor means and said take-up means, said drive means causing said transport surface of said conveyor means to have a higher linear velocity than the linear velocity of said carrier.

4. An apparatus as recited in claim 1 wherein said take-up means includes a pick-up drum rotatably supported below and proximate to said separation edge, said pick-up drum being provided with means for gripping a leading edge of said flexible carrier.

5. An apparatus as recited in claim 4 wherein said pick-up drum includes a cylindrical member and a clamping member disposed within a recess formed in said cylindrical member, said clamping member being radially movable between a clamping position and a non-clamping position.

6. An apparatus as recited in claim 1 wherein said tensioning means includes a clamping member and means biasing said clamping member away from said separation edge.

* * * * *